United States Patent
Kim et al.

(10) Patent No.: US 10,108,250 B2
(45) Date of Patent: Oct. 23, 2018

(54) MEMORY MODULE, SYSTEM INCLUDING THE SAME

(71) Applicant: SK hynix Inc., Icheon-si, Gyeonggi-do (KR)

(72) Inventors: Yong Ju Kim, Seoul (KR); Jung Hyun Kwon, Seoul (KR); Donggun Kim, Hwaseong-si (KR); Sungeun Lee, Icheon-si (KR); Jae Sun Lee, Seoul (KR); Sang Gu Jo, Bucheon-si (KR); Jingzhe Xu, Seoul (KR); Do Sun Hong, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 144 days.

(21) Appl. No.: 15/230,734

(22) Filed: Aug. 8, 2016

(65) Prior Publication Data

US 2017/0329389 A1 Nov. 16, 2017

(30) Foreign Application Priority Data

May 13, 2016 (KR) .................... 10-2016-0058880

(51) Int. Cl.
| | |
|---|---|
| G06F 1/32 | (2006.01) |
| G06F 12/02 | (2006.01) |
| G06F 12/1009 | (2016.01) |
| G06F 12/121 | (2016.01) |
| G11C 11/4074 | (2006.01) |
| G11C 11/4091 | (2006.01) |
| G11C 11/406 | (2006.01) |

(52) U.S. Cl.
CPC .......... *G06F 1/3287* (2013.01); *G06F 1/3275* (2013.01); *G06F 12/0223* (2013.01); *G06F 12/1009* (2013.01); *G06F 12/121* (2013.01); *G11C 11/4074* (2013.01); *G11C 11/4091* (2013.01); *G11C 11/40615* (2013.01); *G11C 2207/2227* (2013.01)

(58) Field of Classification Search
CPC ............... G06F 1/3287; G06F 12/0223; G06F 12/1009; G06F 12/121; G11C 11/40615; G11C 11/4074; G11C 11/4091
See application file for complete search history.

(56) References Cited

U.S. PATENT DOCUMENTS

| | | | |
|---|---|---|---|
| 9,110,784 B2 | 8/2015 | Kwon et al. | |
| 9,436,606 B2* | 9/2016 | Dong | .................. G06F 12/0833 |
| 2003/0200402 A1* | 10/2003 | Willman | ............... G06F 12/145 |
| | | | 711/154 |

(Continued)

*Primary Examiner* — Nanci N Wong
(74) *Attorney, Agent, or Firm* — William Park & Associates Ltd.

(57) ABSTRACT

In an embodiment of the present disclosure, a memory module may be provided. In an embodiment of the present disclosure, a system may be provided. In an embodiment of the present disclosure, an operation of a system and memory module may be provided. The memory module may include a plurality of ranks in which a defragmentation operation of a memory is performed based on entrance of a low-power operation mode, and a vacant region of the memory is powered off based on entrance of a self-refresh mode after the defragmentation operation is ended. The memory module may include a page table of which data are updated based on an ending of the defragmentation operation of the memory.

20 Claims, 7 Drawing Sheets

(56) References Cited

U.S. PATENT DOCUMENTS

| | | | |
|---|---|---|---|
| 2008/0080261 A1* | 4/2008 | Shaeffer | G11C 5/025 |
| | | | 365/189.05 |
| 2012/0084489 A1* | 4/2012 | Gorobets | G06F 12/0246 |
| | | | 711/103 |
| 2014/0226400 A1* | 8/2014 | Kimura | G06F 1/3225 |
| | | | 365/185.08 |
| 2015/0149735 A1 | 5/2015 | Nale et al. | |
| 2016/0093404 A1* | 3/2016 | Huang | G06F 11/073 |
| | | | 714/6.13 |
| 2016/0283391 A1* | 9/2016 | Nilsson | G06F 12/0893 |

\* cited by examiner

| CNANNEL | DIMM | RANK | BANK | ROW | COL | OFFSET |

MEMORY MODULE, SYSTEM INCLUDING THE SAME

CROSS-REFERENCES TO RELATED APPLICATION

The present application claims priority under 35 U.S.C. § 119(a) to Korean application number 10-2016-0058880, filed on May 13, 2016, in the Korean Intellectual Property Office, which is incorporated herein by reference in its entirety.

BACKGROUND

1. Technical Field

Various embodiments may generally relate to a memory module, system including the same, and method of operation, and more particularly, to a technology relating to power consumption during a low-power operation mode.

2. Related Art

In general, semiconductor memory devices are classified into volatile memory devices and nonvolatile memory devices. The volatile memory device loses data stored therein when power is cut off, but the nonvolatile memory can retain data stored therein even though power is cut off. The nonvolatile memory device includes various types of memory cells.

According to the structure or operation method of the memory cells, the volatile memory device may be divided into SRAM (Static RAM) using a flip-flop, DRAM (Dynamic RAM) using a capacitor, and SDRAM (Synchronous DRAM) operating in synchronization with an external device.

According to the structure of the memory cells, the nonvolatile memory device may be divided into a flash memory device, FRAM (Ferroelectric RAM) using ferroelectric capacitors, MRAM (Magnetic RAM) using TMR (Tunneling Magneto-Resistive) layers, a phase change memory device using chalcogenide alloys, and RERAM (Resistive RAM) using transition metal oxide.

In a semiconductor memory device, an operating current refers to a current which is consumed when the semiconductor memory device is operated in an active mode such as a read, write (or program) or erase operation.

On the other hand, a standby current refers to a current which is consumed or leaks when the semiconductor memory device is operated in a standby mode. In general, while the semiconductor memory device is operated in the standby mode, peripheral circuits of the semiconductor memory device are disabled. That is, while the semiconductor memory device is operated in the standby mode, power applied to the peripheral circuits is removed in order to stop the operations of the peripheral circuits of the semiconductor memory device.

While the power applied to the peripheral circuits is removed while the semiconductor memory device is operated in the standby mode, power consumption may be reduced, but the operating speed of the semiconductor memory device is inevitably decreased.

That is, when the semiconductor memory device is switched from the standby mode to the active mode, power is re-supplied to the peripheral circuits. Then, a relatively long time is required until the peripheral circuits to which the power is re-supplied are stabilized. This may serve as a factor which increases the operation time or response time of the semiconductor memory device.

SUMMARY

In an embodiment of the present disclosure, a memory module may be provided. In an embodiment of the present disclosure, a system may be provided. In an embodiment of the present disclosure, an operation of a system and memory module may be provided. The memory module may include a plurality of ranks in which a defragmentation operation of a memory is performed based on entrance of a low-power operation mode, and a vacant region of the memory is powered off based on entrance of a self-refresh mode after the defragmentation operation is ended. The memory module may include a page table of which data are updated based on an ending of the defragmentation operation of the memory.

A method of operating a system comprising: performing a defragmentation operation of a memory based on entrance of a low-power operation mode; updating data of a page table based on an ending of the defragmentation operation of the memory; and powering off a vacant region of the memory based on entrance of a self-refresh mode after the defragmentation operation of the memory is ended.

A method of operating a system further comprising:
powering on the vacant region of the memory device based on ending the low power operation mode.

The page table comprises a page pointer region, a page directory region and a page offset region.

The page pointer region includes an indication for a number of a page for a table entry, wherein the page directory region includes an indication for a name of a directory to which a physical address is allocated based on a virtual address, and wherein the page offset region includes indication for address information for designating a byte in each page.

The low-power operation mode comprises any one of an idle mode, a sleep mode, a power saving mode and a standby mode.

DETAILED DESCRIPTION

Hereinafter, a memory module and a system including the same according to the present disclosure will be described below with reference to the accompanying drawings through examples of embodiments.

Various embodiments may be directed to a memory module capable of reducing power consumption by sorting data stored in a memory during a low-power operation mode of a semiconductor memory device, and a system including the same.

Figure 1:
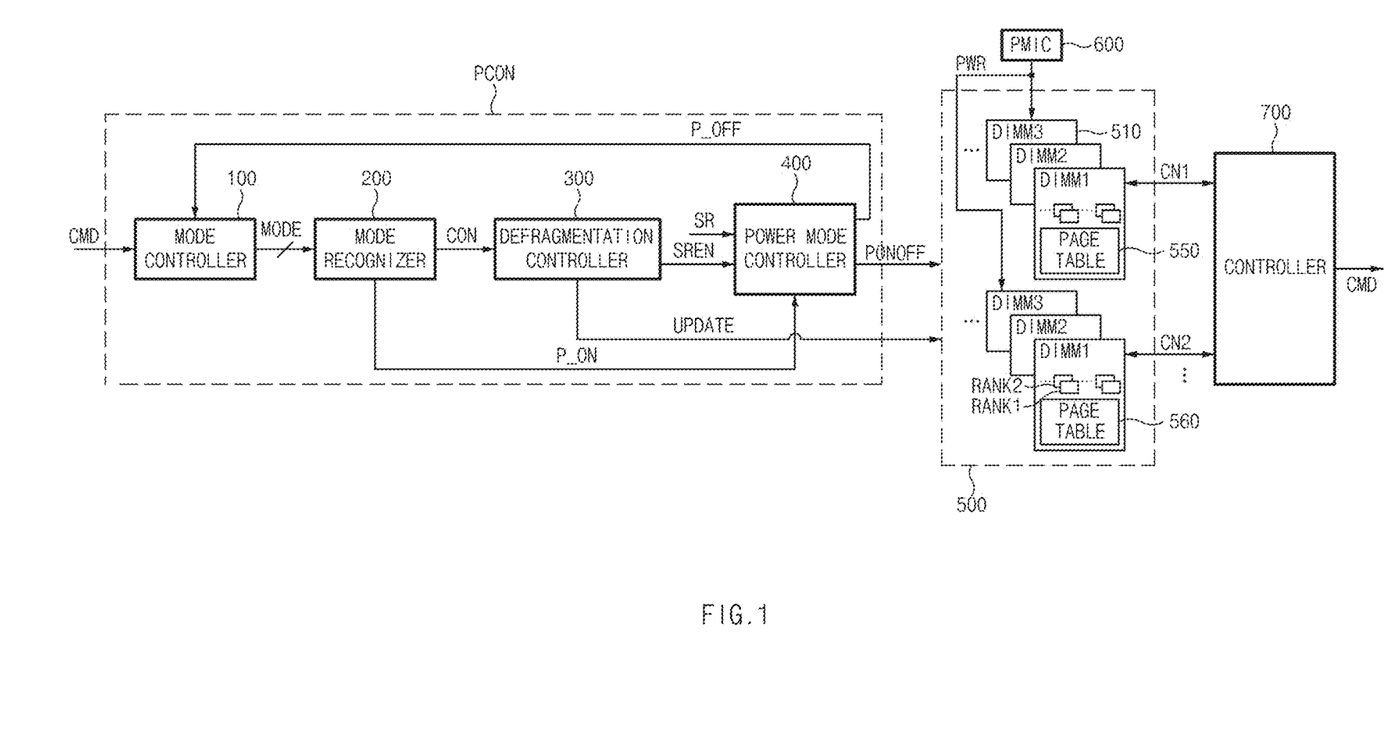
FIG. 1 is a configuration diagram of a system including a memory module according to an embodiment.

FIG. 1 is a configuration diagram of a system including a memory module according to an embodiment.

The system according to a present embodiment may include a power controller PCON, a memory device 500, a power management circuit 600 and a controller 700.

The power controller PCON may control power supplied to the memory device 500 during a low-power operation mode. The power controller PCON may include a mode controller 100, a mode recognizer 200, a defragmentation controller 300 and a power mode controller 400.

The mode controller 100 may sense a power-off signal P_OFF and a low-power command signal CMD and control a mode signal MODE. The mode signal MODE may include a low-power operation mode signal such as an idle mode signal or sleep mode signal. The power-off signal P_OFF may be activated when the system is powered off.

The mode controller 100 may sense the power-off signal P_OFF. When the power-off signal P_OFF is activated, the mode controller 100 may determine that the system entered the low-power operation mode, and control the logic level of the mode signal MODE.

The sleep mode is one of inactive modes for reducing the current consumption of the memory device 500, such as a power saving mode or standby mode. The power saving mode or standby mode may be started according to a chip select signal applied to the memory device 500, and the sleep mode may be started according to a specific low-power command signal CMD. When the low-power command signal CMD or the power-off signal P_OFF is activated, the mode controller 100 may output the mode signal MODE at a logic high level such that the system enters the low-power operation mode.

The mode recognizer 200 may determine whether the mode signal MODE is activated or deactivated, and output a power-on signal P_ON to the power mode controller 400. The power-on signal P_ON may be activated when the system is powered on.

That is, when the idle mode or the low-power operation mode is ended, the mode recognizer 200 may deactivate the mode signal MODE. Then, when the mode signal MODE is deactivated, the mode recognizer 200 may determine that the system entered a normal mode after the idle mode or the low-power operation mode was ended. Thus, the mode recognizer 200 may activate the power-on signal P_ON and output the activated power-on signal P_ON to the power mode controller 400.

The mode recognizer 200 may determine whether the mode signal MODE is activated or deactivated, and output a control signal CON for controlling whether to perform a defragmentation operation for the memory device 500. That is, when the mode signal MODE is activated, the mode recognizer 200 may determine that the system entered the idle mode or the low-power operation mode. Therefore, the mode recognizer 200 may activate the control signal CON for performing a defragmentation operation, when the system enters the idle mode or the low-power operation mode.

The defragmentation controller 300 may perform a defragmentation operation for the memory device 500 when the control signal CON is activated. That is, the defragmentation controller 300 may perform a memory defragmentation operation on the memory device 500 when the control signal CON is activated after the system entered the low-power operation mode. The defragmentation controller 300 may perform a defragmentation operation for pages of the memory device 500 by referring to register bits corresponding to the respective pages.

For example, the defragmentation controller 300 may perform a defragmentation operation to collect pages with a register bit of "1" in a specific region. That is, during the idle mode or low-power operation mode, a variety of application programs called by the operating system (OS) need to be stored in pages of the memory device 500. However, since the memory device 500 includes pages which are not reset because the register bits thereof are set to '1', a defragmentation operation for arranging the pages is performed as a background operation.

When the defragmentation operation for the memory device 500 is ended, the defragmentation controller 300 may output an update signal UPDATE to the memory device 500, in order to update page tables 550 and 560.

That is, since the data of the memory device 500 are transferred to different pages when the defragmentation operation is performed, the data of the page tables 550 and 560 may be updated. At this time, pages of which data were transferred to a specific page through the defragmentation operation and which were reset because the defragmentation operation was ended may be defined as "vacant region". After the defragmentation operation for the memory device 500, the defragmentation controller 300 may activate a refresh enable signal SREN indicating that the defragmentation operation was ended.

Furthermore, the power mode controller 400 may control a power control signal PONOFF supplied to the memory device 500 in response to a self refresh signal SR and the refresh enable signal SREN.

The memory device 500 may be operated in a refresh mode, in order to refresh data stored in a cell array when the system enters the power saving mode. However, as the technology of the memory device 500 shrinks, the refresh cycle is reduced. As the frequency cycle is reduced, the current consumption in the low-power operation mode is gradually increased.

Thus, in a present embodiment, the data stored in the memory device 500 may be sorted during the low-power operation mode. Furthermore, after the defragmentation operation of the memory device 500 is ended, power supplied to the vacant region of the memory device 500 may be removed to reduce power consumption during the low-power operation mode.

For example, when both of the self refresh signal SR and the refresh enable signal SREN are activated, the power mode controller 400 may deactivate the power control signal PONOFF. When the power control signal PONOFF of the power mode controller 400 is deactivated to control the memory device 500 to operate in the low-power operation mode, the power supplied to the vacant region of the memory device 500 may be removed.

When the power supply is removed, the power mode controller 400 may output the power-off signal P_OFF to the mode controller 100, thereby reducing the standby current or leakage current which is consumed while the memory device 500 is operated in the low-power operation mode.

On the other hand, when one or more of the self refresh signal SR and the refresh enable signal SREN are deactivated, the power mode controller 400 may deactivate the power control signal PONOFF.

That is, when the self refresh signal SR is deactivated, it may indicate that the memory device 500 does not enter the self refresh mode, and when the refresh enable signal SERN is deactivated, it may indicate that the defragmentation operation of the memory device 500 is not ended. Thus, when the defragmentation operation is not ended during the self refresh mode, the power of the memory device 500 is not removed.

When the power-on signal P_ON of the mode recognizer 200 is activated, the power mode controller 400 may activate the power control signal PONOFF to supply power to the memory device 500.

The memory device 500 may be operated according to control of the controller 700. The memory device 500 may be coupled to the controller 700 through channels CN1 and CN2.

The memory device 500 may include a plurality of memory modules 510. The memory module 510 may include DIMM (Dual In-Line Memory Module).

In an embodiment, it has been described that the memory module 510 includes DIMM. However, the present embodiments are not limited thereto, but may include various types of memory modules 510.

Depending on embodiments, the memory module 510 may include, for example but not limited to, UDIMM (Unbuffered Dual In-line Memory Module), RDIMM (Registered Dual In-line Memory Module), FBDIMM (Fully Buffered Dual In-line Memory Module), LRDIMM (Load Reduced Dual In-line Memory Module) or another memory module.

The memory device 500 may receive commands, addresses and data from the controller 700 through the channels CN1 and CN2. The memory device 500 may further include a buffer which buffers a command, address and data and provides the buffered command, address and data to a memory. Each of the memory modules 510 of the memory device 500 may include a plurality of ranks RANK1, RANK2, . . . and a page table 550 or 560.

The rank may indicate a group of chips which share one chip select signal. The chips belonging to the same rank may share the same chip select signal and the same control signal and address, while pins for receiving data are separated from each other. Therefore, the memory chips belonging to the same rank can be logically considered as one memory chip, and operated at the same time.

Each memory module 510 of the memory device 500 may perform a defragmentation operation according to control of the defragmentation controller 300. That is, when the control signal CON is activated, the memory module 510 of the memory device 500 may enter the low-power operation mode to perform a memory defragmentation operation.

When the defragmentation operation of the memory device 500 is ended, the page tables 550 and 560 may be updated by the update signal UPDATE. The page tables 550 and 560 may perform translation between a virtual address and a physical address space.

The power management circuit 600 may include a PMIC (Power Management IC). The power management circuit 600 may serve to distribute external power or power PWR supplied through a battery to a plurality of regions in the memory device 500.

That is, the power management circuit 600 may manage powers of the respective devices forming the system, such the power of the battery can be efficiently used. In particular, the power management circuit 600 can minimize the power consumption of the memory device 500 in the low-power operation mode such as a standby mode, sleep mode, power-down mode or deep power-down mode.

For this operation, the power management circuit 600 may include various power management circuits. For example, the power management circuits may include, for example but not limited to, a regulator, an inverter, a converter and a driver circuit.

The controller 700 may control the memory device 500 through the channels CH1 and CH2 such as a control bus, a data bus, and an address bus. The controller 700 may exchange data with the memory device 500 through the channels CH1 and CH2.

The controller 700 may control or access the memory device 500 coupled to the channels CH1 and CH2. For example, in order to drive a program such as the OS at boot time, the controller 700 may access the memory device 500 according to a determined sequence, and manage all control operations.

The controller 700 may be included in a processor such as a CPU (Central Processing Unit), a GPU (Graphic Processing Unit) or an AP (Application Processor), and exist on a memory module 510 of the memory module 510. The controller 700 may exist in various types. For example, the controller 700 may exist on a separate chip in a system including the memory device 500, such as a computing device or mobile phone.

Figure 2:
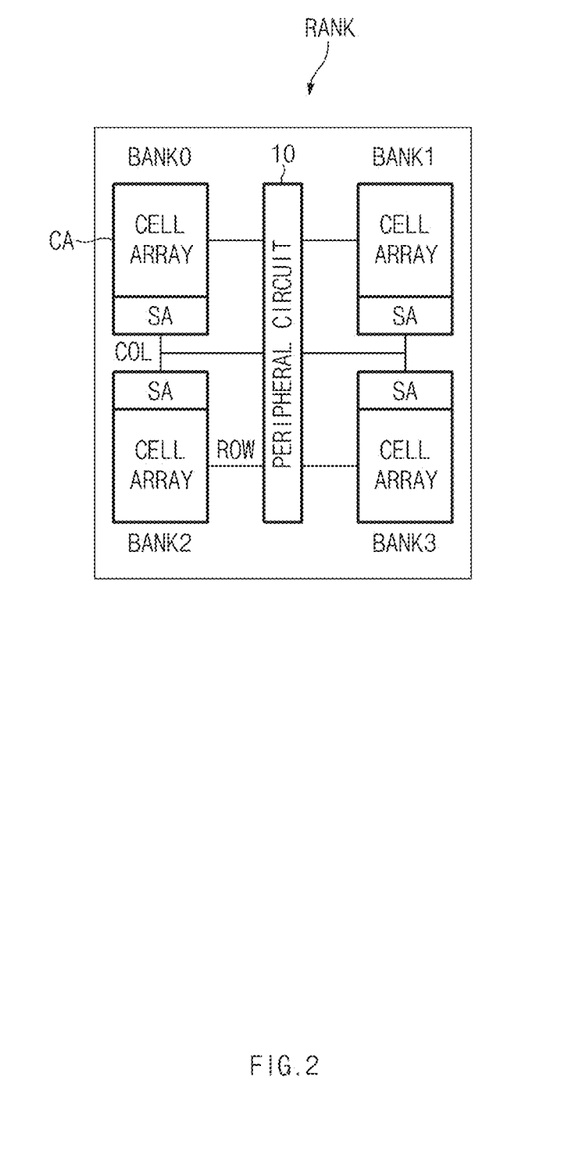
FIG. 2 is a circuit diagram of a rank of FIG. 1.

FIG. 2 is a circuit diagram of a rank of FIG. 1.

The rank may include a plurality of banks BANK0 to BANK3 and a peripheral circuit 10. In an embodiment, the number of banks BANK0 to BANK3 is set to 4. However, the number of banks is not limited thereto, but may be changed to various values.

Each of the banks BANK0 to BANK3 may include a cell array CA and a sense amplifier SA. The cell array CA may include a plurality of unit cells from or to which data are read or written. The sense amplifier SA may sense and amplify the data of the cell array CA. The peripheral circuit 10 may include circuits for driving and controlling the operation of the cell array CA.

The data sensed by the sense amplifier SA may be transferred to the peripheral circuit 10 through a column line COL. In the cell array CA, a plurality of unit cells may be selectively enabled through a row line ROW.

In an embodiment, the memory module 510 may include a plurality of ranks RANK, and each of the ranks RANK may include one or more memory integrated circuits. The one or more memory integrated circuits may include various types of memory integrated circuits such as DRAM circuits, SRAM circuits or NVRAM (Nonvolatile RAM) circuits. In an embodiment, the one or more memory integrated circuits may be set to DRAM circuits.

Figure 3:
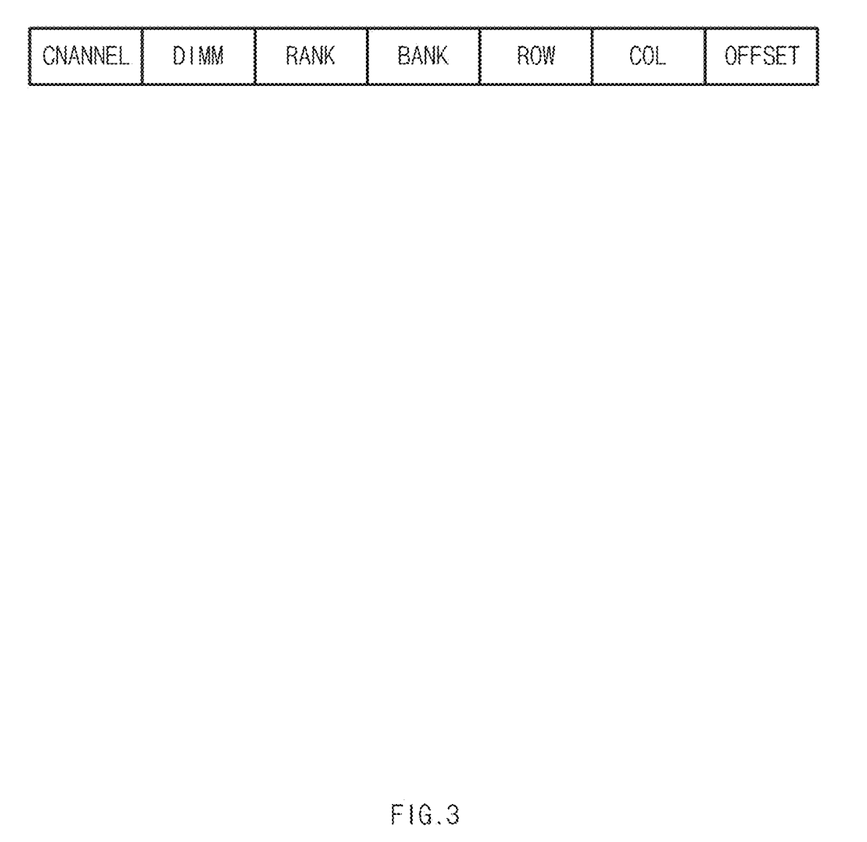
FIG. 3 is a diagram for describing a mapping method of a physical memory in a memory device of FIG. 1.

FIG. 3 is a diagram for describing a mapping method of a physical memory in the memory device 500 of FIG. 1.

The memory region of the memory device 500 may be mapped in a physical unit of channel CN1 or CN2, memory module 510, rank RANK, bank BANK, row line ROW, column line COL or offset.

When entering the low-power operation mode, the memory device 500 may perform a defragmentation operation in a unit of channel CN1 or CN2, a unit of memory module 510, a unit of rank RANK and a unit of bank BANK, and then enter the self refresh mode. At this time, the defragmentation operation may be performed according to the priority order of the channel CH1 or CH2, the memory module 510, the rank RANK and the bank BANK.

The memory device 500 may be powered off in a physical unit after the defragmentation operation is performed. In the memory device 500, each channel CH1 or CN2, each memory module 510, each rank RANK, each bank BANK, each row line ROW, each column line COL or each offset may be mapped to perform the power-off operation.

For example, when there occurs a channel including a vacant region (for example, channel CH1) after the defragmentation operation, the channel may be powered off. When the power management circuit 600 is provided, a memory module 510 including a vacant region may be powered off. On the other hand, when the power management circuit 600 is not separately provided but the power-off mode is set in each memory region, all memory regions of the corresponding memory module 510 may be powered off.

In the case of the ranks RANK, all memory regions of a rank RANK including a vacant region may be powered off. In the case of the banks BANK having the power down mode, a bank including a vacant region may be powered off.

For this operation, the system according to a embodiment may include the power down mode or power supply circuit for powering off each channel CH1 or CH2, each memory module 510, each rank RANK or each bank BANK.

Figure 4:
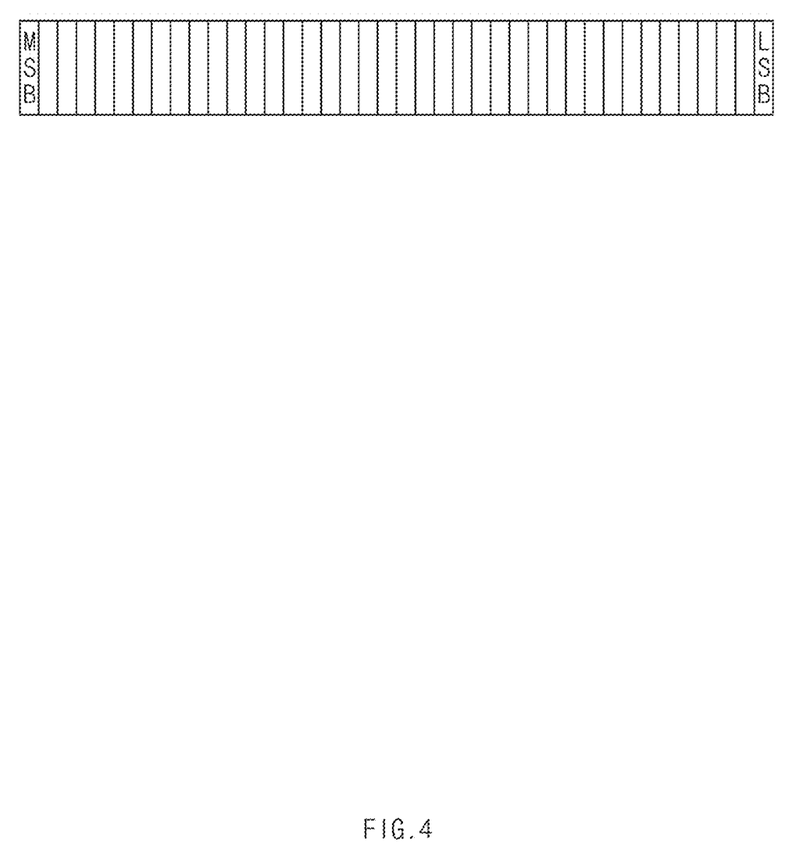
FIG. 4 is a diagram for describing an address space in the memory device of FIG. 1.

FIG. 4 is a diagram for describing the address space in the memory device 500 of FIG. 1.

In the memory device 500, the first address may correspond to the MSB (Most Significant Bit), and the last address may correspond to the LSB (Least Significant Bit). Therefore, all addresses of the memory device 500 between the MSB and the LSB may be mapped to physical addresses illustrated in FIG. 3. The MSB address may include reference addresses of the page tables 550 and 560.

That is, the memory device 500 may receive data and a physical address from the controller 700 through the peripheral circuit 10. In the memory device 500, a row line ROW and a column line COL may be selected by the physical address, and a page of the cell array CA may be specified. Furthermore, data read from a page of the cell array CA may be outputted to the controller 700 through the peripheral circuit 10.

Figure 5:
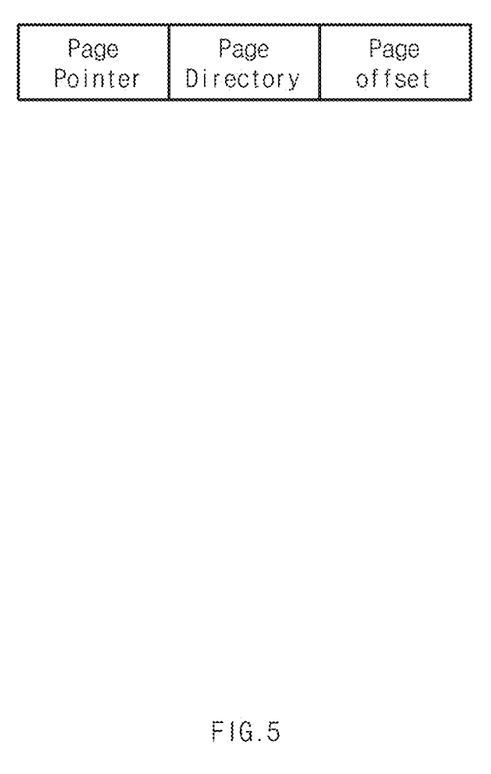
FIG. 5 is a configuration diagram of page tables of FIG. 1.

FIG. 5 is a configuration diagram of the page tables 550 and 560 of FIG. 1.

An operating system (OS), application programs and various data managed by the OS or application programs may be loaded to the page table 550 and 560 of the memory device 500. That is, the page tables 550 and 560 may page memory data structures which are generated and retained by OS software (that is, the OS).

The page tables 550 and 560 may include a page pointer region, a page directory region and a page offset region. The page tables 550 and 560 may store data updated by the update signal UPDATE.

That is, the page pointer region may indicate the number of a page for a table entry. The page directory region may indicate the name of a directory to which a physical address is allocated in response to a virtual address. The page offset region may indicate address information for designating a specific byte in each page. That is, the page offset region may be used to specify the address space illustrated in FIG. 4.

The page tables 550 and 560 may include a register bit which is set according to whether a program corresponding to each page is executed. The page tables 550 and 560 may be managed in a unit of page pointer, page directory or page offset.

Figure 6:
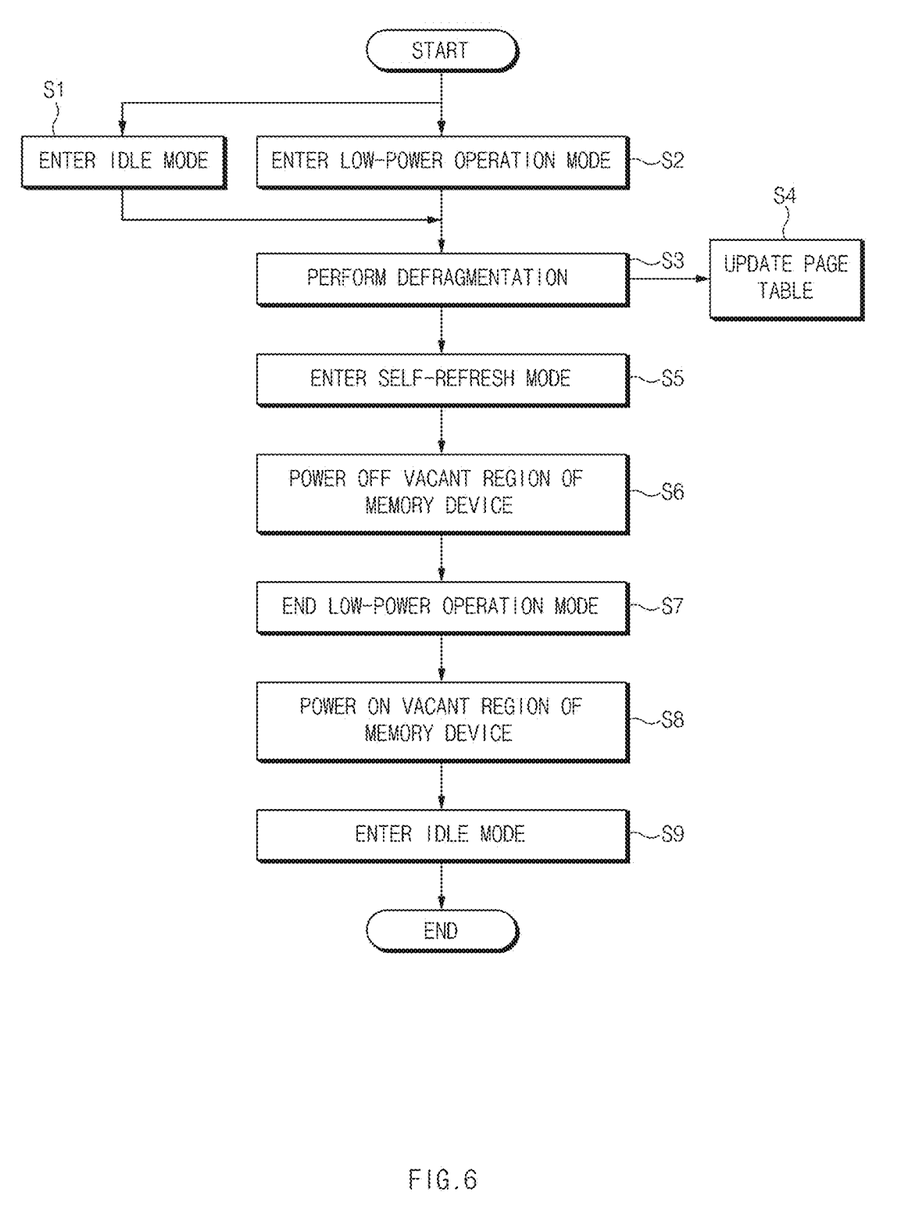
FIG. 6 is an operation flowchart of the system according to an embodiment.

FIG. 6 is an operation flowchart of the system according to an embodiment.

When the system enters the idle mode at step S1, a defragmentation operation of the memory device 500 may be performed as a background operation at step S3. When the system enters the low-power operation mode at step S2, the defragmentation operation of the memory device 500 may be performed at step S3.

The low-power operation mode is an operation mode where the power consumption of the memory device 500 is minimized. For example, the low-power operation mode may include, but is not limited to, a sleep mode, a standby mode, a power down mode, a deep power down mode, an idle mode and a power saving mode.

When the defragmentation operation of the memory device 500 is ended, the page tables 550 and 560 may be updated by the update signal UPDATE of the defragmentation controller 300 at step S4.

When the self refresh signal SR is activated to enter the self refresh mode at step S5, a vacant region of the memory device 500 may be powered off at step S6. The self refresh mode is a partial low-power operation mode, and only a part of the functions of the memory device 500 (for example, refresh operation) may be performed in the self refresh mode.

The semiconductor integrated circuits for low power consumption have employed a technology for removing power supply to a circuit region which is not operated, in order to reduce the use of a battery. This technology may be referred to as the sleep mode. According to control of a sleep mode signal, a minimum of functions in a semiconductor memory device may be left, and the other functions may be disabled.

In an embodiment, when the system enters the low-power operation mode such as the sleep mode, the defragmentation operation of the memory device 500 may be performed. After the defragmentation operation is ended, power supply to the vacant region of the memory device 500 may be removed in the self refresh mode.

When the low power operation mode is ended at step S7, the vacant region of the memory device 500 may be powered on at step S8. Then, the memory device 500 may be operated in the normal mode to perform a typical function (for example, data communication). Then, the memory device 500 may reenter the idle mode at step S9.

The system according to an embodiment may be applied to, for example but not limited to, a cell phone, a PCS (Personal Communication System), a PDA (Personal Digital Assistant), a portable GPS device, a tablet computer and the like. Furthermore, the system may be applied to a PC, a desktop computer, a laptop computer, a notebook computer, a server computer and the like.

Figure 7:
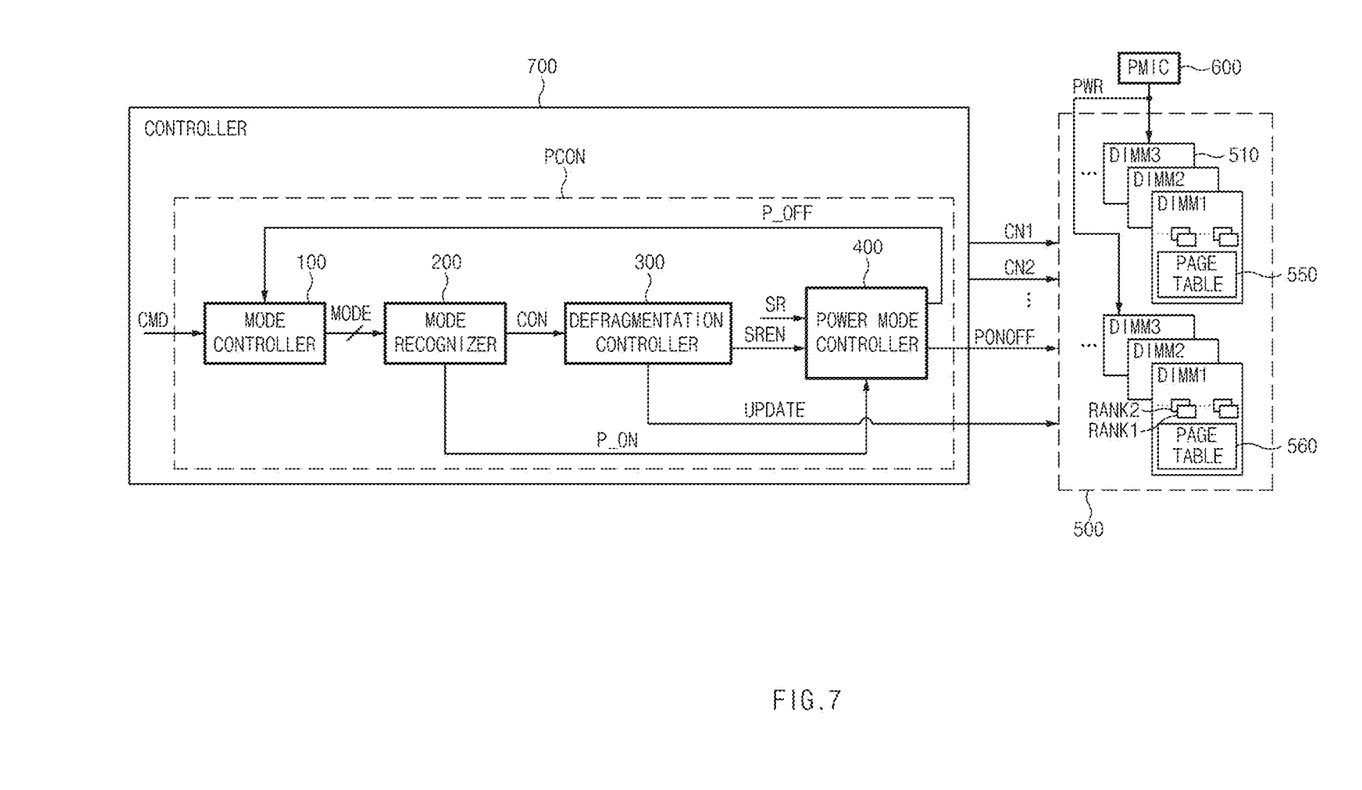
FIG. 7 is a configuration diagram of a system including a memory module according to an embodiment.

FIG. 7 is a configuration diagram of a system including a memory module according to an embodiment.

In an embodiment of FIG. 1, it has been described that the power controller PCON is installed separately from the controller 700, operated in response to the low-power command signal CMD applied from the 700, and operated by the OS controlled by the controller 700.

In an embodiment, however, the power controller PCON may be included in the controller 700 as illustrated in FIG. 7. That is, the power controller PCON may be included in the controller 700 and operated in response to an internally generated power command signal CMD.

According to an embodiment, the memory module and the system including the same can reduce power consumption by sorting data stored in a memory during the low-power operation mode of a semiconductor memory device.

While certain embodiments have been described above, it will be understood to those skilled in the art that the embodiments described are by way of example only. Accordingly, the memory module described herein should not be limited based on the described embodiments. Rather, the memory module described herein should only be limited in light of the claims that follow when taken in conjunction with the above description and accompanying drawings.

What is claimed is:

1. A memory module comprising:
    a plurality of ranks in which a defragmentation operation of a memory is performed based on entrance of a low-power operation mode, and a vacant region of the memory is powered off based on entrance of a self-refresh mode after the defragmentation operation is ended;
    a page table of which data are updated based on an ending of the defragmentation operation of the memory;
    a mode recognizer configured to output a power-on signal and a control signal based on whether a mode signal is activated;
    a defragmentation controller configured to perform the defragmentation operation based on activation of the control signal, and activate a refresh enable signal based on an ending of the defragmentation operation; and
    a power mode controller configured to control power supplied to the memory based on the refresh enable signal, a self refresh signal and the power-on signal.

2. The memory module according to claim 1, wherein in the plurality of ranks, power is supplied to the vacant region based on an ending of the low-power operation mode.

3. The memory module according to claim 1, wherein each of the ranks comprises:
    a plurality of banks from or to which data are read or written;
    a sense amplifier configured to sense and amplify data stored in the plurality of banks; and
    a peripheral circuit configured to control the defraqmentation operation of a cell array.

4. The memory module according to claim 1, wherein the page table comprises a page pointer region, a page directory region and a page offset region.

5. The memory module according to claim 4,
    wherein the page pointer region includes an indication for a number of a page for a table entry,
    wherein the page directory region includes an indication for a name of a directory to which a physical address is allocated based on a virtual address, and
    wherein the page offset region includes indication for address information for designating a byte in each page.

6. A system comprising:
    a memory device in which a defragmentation operation of a memory is performed based on entrance of a low-power operation mode;
    a power controller configured to selectively control power supplied to the memory device during the low-power operation mode, and power off a vacant region of the memory device based on entrance of a self refresh mode after the defragmentation operation is ended; and
    a controller coupled to the memory device through a channel and configured to control the operation of the memory device,
    wherein the power controller comprises:
    a mode recognizer configured to output a power-on signal and a control signal based on whether a mode signal is activated;
    a defragmentation controller configured to perform the defragmentation operation based on activation of the control signal, and activate a refresh enable signal based on an ending of the defragmentation operation; and
    a power mode controller configured to control power supplied to the memory device based on the refresh enable signal, a self refresh signal and the power-on signal.

7. The system according to claim 6, wherein the power controller further comprises:
    a mode controller configured to sense a power-off signal and a low-power command signal and output the mode signal.

8. The system according to claim 6, wherein the memory device comprises a page table of which data are updated based on an update signal when the defragmentation operation is ended.

9. The system according to claim 8, wherein the defragmentation controller outputs the update signal for updating the page table based on an ending the defragmentation operation.

10. The system according to claim 7, wherein the power mode controller deactivates a power control signal to remove power supplied to the vacant region, based on activation of both the self refresh signal and the refresh enable signal, wherein the power mode controller outputs the power-off signal to the mode controller based on removal of the power supply.

11. The system according to claim 6, wherein the power mode controller activates a power control signal to supply power to the memory device, based on deactivation of the refresh enable signal, wherein the power mode controller activates a power control signal to supply power to the memory device, based on activation of the power-on signal.

12. The system according to claim 6, wherein based on deactivation of the mode signal, the mode recognizer determines that the low-power operation mode was ended, and activates the power-on signal, and
    based on activation of the mode signal, the mode recognizer determines that the system entered the low-power operation mode, and activates the control signal.

13. The system according to claim 6, wherein the memory device comprises a plurality of memory modules.

14. The system according to claim 13, wherein each of the memory modules comprises a plurality of ranks.

15. The system according to claim 14, wherein each of the ranks comprises:
    a plurality of banks from or to which data are read or written; and
    a peripheral circuit configured to control the operations of the plurality of banks.

16. The system according to claim 6, further comprising a power management circuit configured to supply power to the memory device.

17. The system according to claim 6, wherein the low-power operation mode comprises any one of an idle mode, a sleep mode, a power saving mode and a standby mode.

18. The system according to claim 6, wherein the memory device performs the defragmentation operation according to the priority order of the channel, a memory module, a rank and a bank.

19. The system according to claim 6, wherein in the memory device, a physical memory is mapped for the channel, a memory module, a rank, a row line, a column line or an offset.

20. The system according to claim 6, wherein the controller includes the power controller and the power controller is configured to operate based on an internally generated power command signal.

* * * * *